United States Patent
Chen et al.

(10) Patent No.: US 10,522,631 B2
(45) Date of Patent: Dec. 31, 2019

(54) CONTACT SILICIDE HAVING A NON-ANGULAR PROFILE

(71) Applicant: Taiwan Semiconductor Manufacturing Company, Ltd., Hsinchu (TW)

(72) Inventors: Sheng-Wen Chen, Tainan (TW); Shih Yu-Shen, Hemei Township (TW); Chia Ping Lo, Jhubei (TW); Yan-Hua Lin, Tainan (TW); Lun-Kuang Tan, Hsinchu (TW); Yu-Ting Lin, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/042,287

(22) Filed: Jul. 23, 2018

(65) Prior Publication Data

US 2018/0350924 A1 Dec. 6, 2018

Related U.S. Application Data

(62) Division of application No. 14/209,374, filed on Mar. 13, 2014, now Pat. No. 10,032,876.

(51) Int. Cl.
*H01L 29/417* (2006.01)
*H01L 21/285* (2006.01)
(Continued)

(52) U.S. Cl.
CPC .. *H01L 29/41725* (2013.01); *H01L 21/26506* (2013.01); *H01L 21/26593* (2013.01);
(Continued)

(58) Field of Classification Search
CPC ......... H01L 29/41725; H01L 21/76814; H01L 29/66575; H01L 21/26506; H01L 21/324;
(Continued)

(56) References Cited

U.S. PATENT DOCUMENTS 5,885,896 A 3/1999 Thakur et al.
5,897,373 A 4/1999 Peng et al.
(Continued)

FOREIGN PATENT DOCUMENTS

TW 200507225 A 2/2005

OTHER PUBLICATIONS

Taiwanese Application No. 10521566100, Office Action dated Dec. 20, 2016.
(Continued)

*Primary Examiner* — John P. Dulka
(74) *Attorney, Agent, or Firm* — Haynes and Boone, LLP

(57) ABSTRACT

A semiconductor device includes a transistor having a source/drain region. A conductive contact is disposed over the source/drain region. A silicide element is disposed below the conductive contact. The silicide element has a non-angular cross-sectional profile. In some embodiments, the silicide element may have an approximately curved cross-sectional profile, for example an ellipse-like profile. The silicide element is formed at least in part by forming an amorphous region in the source/drain region via an implantation process. The implantation process may be a cold implantation process.

20 Claims, 12 Drawing Sheets

(51) Int. Cl.
*H01L 21/265* (2006.01)
*H01L 21/324* (2006.01)
*H01L 29/66* (2006.01)
*H01L 21/768* (2006.01)
*H01L 29/78* (2006.01)

(52) U.S. Cl.
CPC ...... *H01L 21/28518* (2013.01); *H01L 21/324* (2013.01); *H01L 21/76814* (2013.01); *H01L 29/66575* (2013.01); *H01L 21/76843* (2013.01); *H01L 21/76855* (2013.01); *H01L 29/7833* (2013.01)

(58) Field of Classification Search
CPC ......... H01L 21/26593; H01L 21/28518; H01L 21/76855; H01L 21/76843; H01L 29/7833
See application file for complete search history.

(56) References Cited

U.S. PATENT DOCUMENTS

| | | | |
|---|---|---|---|
| 6,518,176 B2 | 2/2003 | Guo et al. | |
| 6,849,527 B1 * | 2/2005 | Xiang | H01L 21/26506 438/528 |
| 7,207,339 B2 | 4/2007 | Chen et al. | |
| 7,335,595 B2 | 2/2008 | Robertson et al. | |
| 7,462,537 B2 | 12/2008 | Wang et al. | |
| 7,759,208 B1 | 7/2010 | Frye et al. | |
| 7,786,025 B1 | 8/2010 | Gluschenkov et al. | |
| 7,799,682 B2 | 9/2010 | Beyer et al. | |
| 7,897,513 B2 | 3/2011 | Bu et al. | |
| 8,178,819 B2 | 5/2012 | Jennings et al. | |
| 8,349,718 B2 | 1/2013 | Uozumi | |
| 8,664,070 B2 | 3/2014 | Liu et al. | |
| 8,956,885 B2 | 2/2015 | Barash et al. | |
| 8,969,946 B2 | 3/2015 | Jhang et al. | |
| 2002/0068408 A1 | 6/2002 | Paton et al. | |
| 2003/0196996 A1 | 10/2003 | Jennings et al. | |
| 2004/0058512 A1 | 3/2004 | Jennings et al. | |
| 2004/0126999 A1 | 7/2004 | Ramachandran et al. | |
| 2005/0124128 A1 | 6/2005 | Kim | |
| 2005/0142868 A1 | 6/2005 | Kuo | |
| 2005/0199908 A1 | 9/2005 | Geiss et al. | |
| 2005/0282335 A1 | 12/2005 | Okonogi et al. | |
| 2007/0141798 A1 | 6/2007 | Bohr | |
| 2007/0238202 A1 | 10/2007 | Ranish et al. | |
| 2008/0237603 A1 | 10/2008 | Lodha et al. | |
| 2009/0191707 A1 | 7/2009 | Okada et al. | |
| 2009/0315185 A1 | 12/2009 | Boyanov et al. | |
| 2010/0041219 A1 | 2/2010 | Hatem et al. | |
| 2010/0048005 A1 | 2/2010 | Seebauer | |
| 2010/0052166 A1 | 3/2010 | Mukherjee et al. | |
| 2010/0093139 A1 | 4/2010 | Futase | |
| 2010/0109046 A1 | 5/2010 | Mehandru et al. | |
| 2010/0155954 A1 | 6/2010 | Mukherjee et al. | |
| 2010/0233886 A1 | 9/2010 | Yang et al. | |
| 2011/0033998 A1 | 2/2011 | Hatem et al. | |
| 2011/0084320 A1 | 4/2011 | Jung | |
| 2011/0108796 A1 | 5/2011 | Wang et al. | |
| 2011/0151635 A1 | 6/2011 | Liu et al. | |
| 2011/0169049 A1 | 7/2011 | Loo et al. | |
| 2011/0227170 A1 * | 9/2011 | Zhu | H01L 29/1054 257/410 |
| 2011/0248355 A1 | 10/2011 | Futase | |
| 2011/0309374 A1 | 12/2011 | Wang et al. | |
| 2012/0018815 A1 | 1/2012 | Toh et al. | |
| 2012/0068180 A1 * | 3/2012 | Mehandru | H01L 21/26506 257/57 |
| 2012/0077305 A1 | 3/2012 | Ramappa | |
| 2012/0112292 A1 | 5/2012 | Lavoie et al. | |
| 2012/0119302 A1 | 5/2012 | Pei et al. | |
| 2012/0205728 A1 | 8/2012 | Yin et al. | |
| 2012/0208333 A1 | 8/2012 | Lee et al. | |
| 2012/0313158 A1 | 12/2012 | Yin et al. | |
| 2013/0017678 A1 | 1/2013 | Tsai et al. | |
| 2013/0043511 A1 | 2/2013 | Tsai et al. | |
| 2013/0059434 A1 | 3/2013 | Yang et al. | |
| 2013/0071981 A1 | 3/2013 | Huang et al. | |
| 2013/0078800 A1 | 3/2013 | Lai et al. | |
| 2013/0146895 A1 | 6/2013 | Tsai et al. | |
| 2013/0240990 A1 | 9/2013 | Yin et al. | |
| 2013/0249099 A1 | 9/2013 | Lavoie et al. | |
| 2013/0256679 A1 * | 10/2013 | Yao | H01L 29/41725 257/76 |
| 2013/0285157 A1 | 10/2013 | Yin et al. | |
| 2013/0288438 A1 | 10/2013 | Jensen et al. | |
| 2013/0288487 A1 | 10/2013 | Scheer et al. | |
| 2013/0295734 A1 * | 11/2013 | Niebojewski | H01L 29/66477 438/197 |
| 2013/0316535 A1 * | 11/2013 | Shin | H01L 21/28 438/682 |
| 2014/0134852 A1 | 5/2014 | Izawa et al. | |
| 2014/0191312 A1 | 7/2014 | Kim et al. | |
| 2014/0264544 A1 | 9/2014 | Jhang et al. | |
| 2015/0028447 A1 | 1/2015 | Zhang et al. | |
| 2015/0035055 A1 | 2/2015 | Wang | |
| 2015/0162415 A1 * | 6/2015 | Yin | H01L 29/665 257/347 |
| 2015/0200269 A1 | 7/2015 | Yin et al. | |
| 2015/0206881 A1 | 7/2015 | Tsai et al. | |
| 2015/0243565 A1 | 8/2015 | Nieh et al. | |
| 2015/0263109 A1 | 9/2015 | Chen et al. | |
| 2015/0270179 A1 | 9/2015 | Alptekin et al. | |
| 2015/0287834 A1 | 10/2015 | Liao et al. | |
| 2017/0194155 A1 * | 7/2017 | Anderson | H01L 21/28518 |
| 2018/0308952 A1 * | 10/2018 | Adusumilli | H01L 29/665 |
| 2019/0131421 A1 * | 5/2019 | Shen | H01L 29/665 |
| 2019/0267376 A1 * | 8/2019 | Chiang | H01L 27/0922 |

OTHER PUBLICATIONS

Lauwers, A., et al., "Low Temperature Spike Anneal for Ni-Silicide Formation", Microelectronic Engineering, vol. 76, pp. 303-310 (2004).

Wang, Yu, et al., "Laser Spike Annealing and its Application to Leading-Edge Logic Device", 16th IEEE International Conference on Advanced Thermal Processing of Semiconductors, 7 pgs. (2008).

* cited by examiner

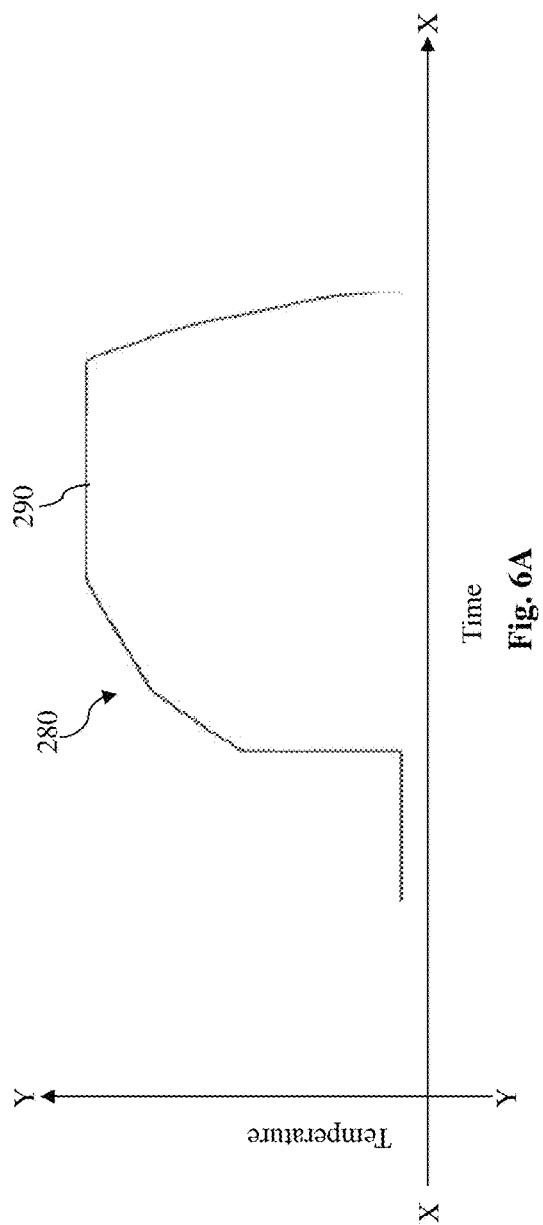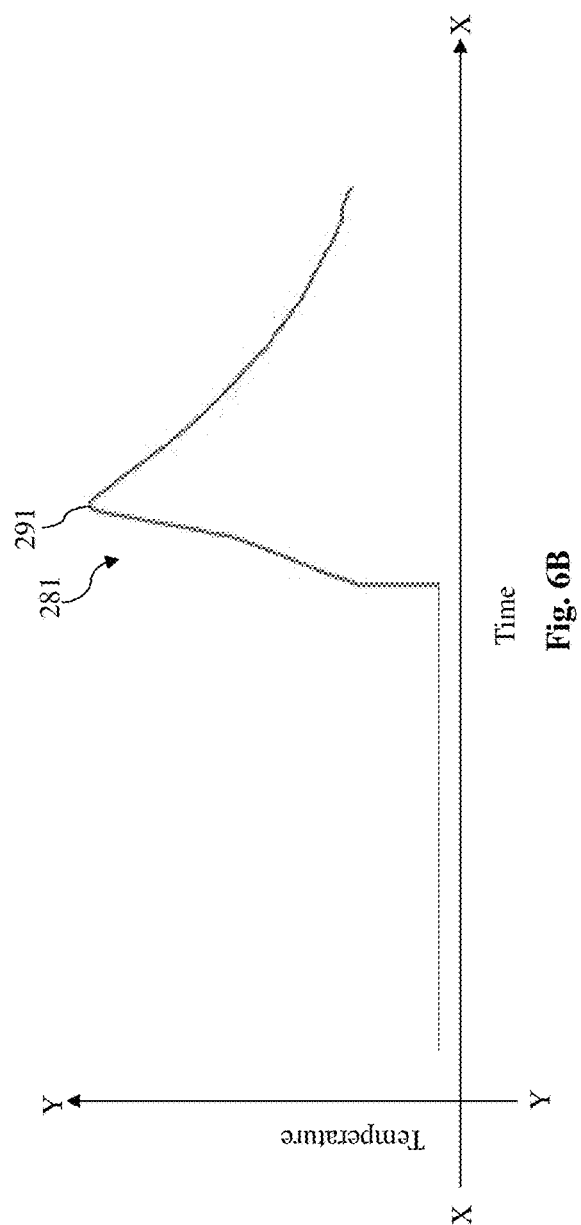

CONTACT SILICIDE HAVING A NON-ANGULAR PROFILE

PRIORITY CLAIMS AND CROSS-REFERENCE

The present application is a divisional patent application of U.S. patent application Ser. No. 14/209,374, entitled "Contact Silicide Having a Non-Angular Profile", filed on Mar. 13, 2014, now U.S. Pat. No. 10,032,876, the entire disclosure of which is hereby incorporated by reference in its entirety. The present application is also related to U.S. patent application Ser. No. 14/308,976, entitled "Contact Silicide Formation Using a Spike Annealing Process," filed on Jun. 19, 2014, the entire disclosure of which is hereby incorporated by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

As the semiconductor industry progresses into nanometer technology process nodes in pursuit of higher device density, higher performance, and lower costs, challenges from both fabrication and design have resulted in the development of multilayer (or three dimensional) integrated devices. For example, as device sizes continue to shrink, conventional methods of forming contact holes (or contacts) have led to problems such as non-uniform silicide grain size, excessive contact resistance, leakage issues, etc. As a result, semiconductor device performance may be degraded and defect count may increase. Therefore, while existing methods of fabricating semiconductor devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A and 6B are annealing profiles associated with an example conventional annealing process and an embodiment of a spike annealing process of the present disclosure, respectively.

DETAILED DESCRIPTION

Figure 1:
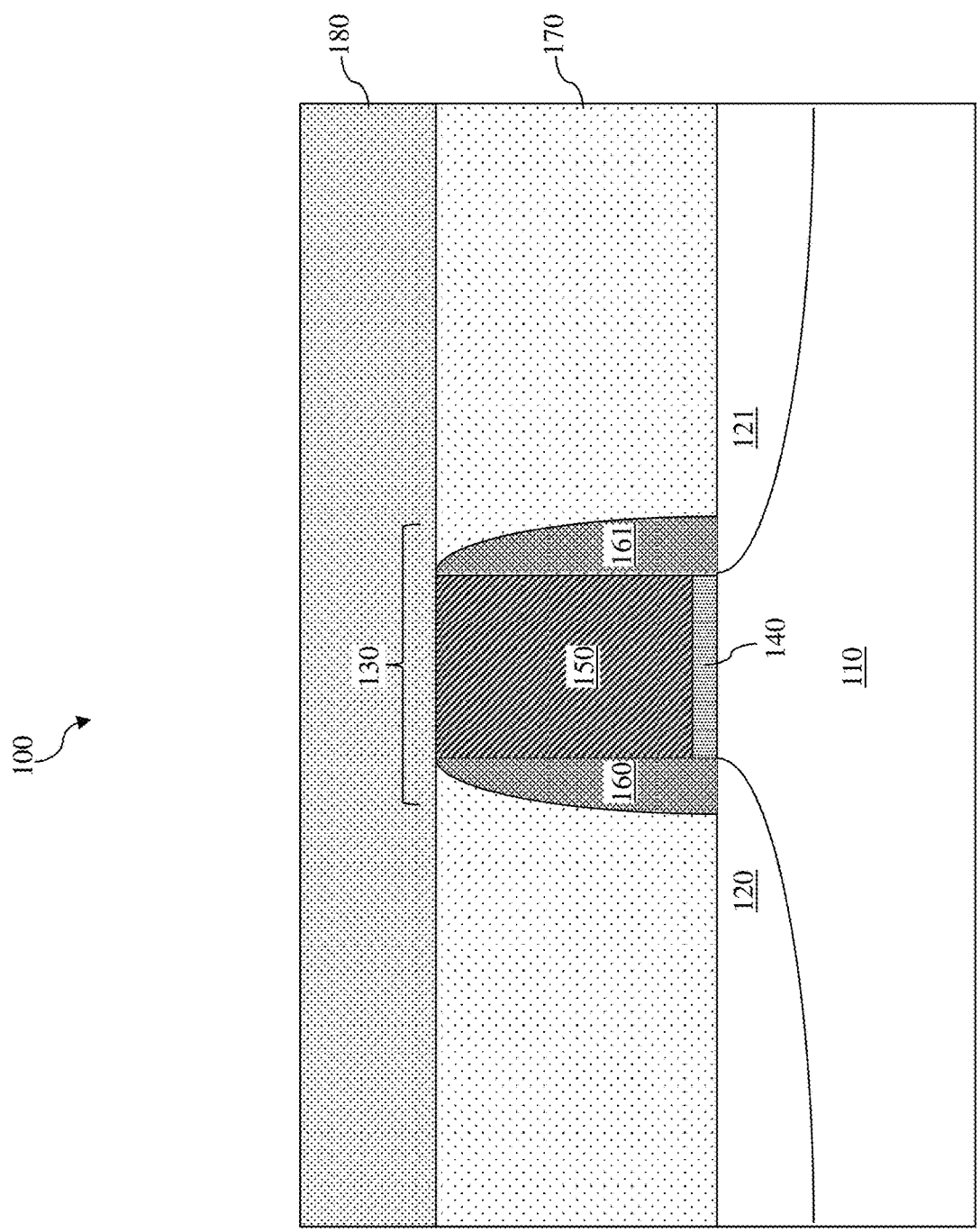
FIGS. 1-5 and 7-9 are simplified diagrammatic cross-sectional side views of a semiconductor device at various stages of fabrication in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-5 and 7-9 are diagrammatic fragmentary cross-sectional side views of a semiconductor device 100 at various stages of fabrication. The semiconductor device 100 may include an integrated circuit (IC) chip, system on chip (SoC), or portion thereof. The semiconductor device 100 may also include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors. It is understood that FIGS. 1-5 and 7-9 have been simplified for a better understanding of the inventive concepts of the present disclosure, and various elements of the semiconductor device 100 may not be specifically illustrated for reasons of simplicity.

Referring to FIG. 1, the semiconductor device 100 includes a substrate 110. In the illustrated embodiment, the substrate 110 is a silicon substrate, though it is understood that other types of substrates may also be used in alternative embodiments. For example, the substrate 110 may also be a silicon germanium substrate, silicon carbide substrate, etc. The substrate 110 may also be slightly doped, for example by an n-type dopant or a p-type dopant.

The substrate 110 may include various doped regions, such as source/drain regions 120-121 of a transistor device. The source/drain regions 120-121 may be n-type regions in a p-type substrate 110, or may be p-type regions in an n-type substrate 110. The source/drain regions 120-121 may also each include a lightly-doped portion and a heavily doped portion, which are not specifically illustrated for reasons of simplicity.

A gate structure 130 is formed over the substrate 110. The gate structure 130 includes a gate dielectric 140, a gate electrode 150 formed over the gate dielectric 140, and gate spacers 160 disposed on sidewalls of the gate dielectric 140 and the gate electrode 150. It is understood that the gate dielectric 140 and the gate electrode 150 are formed before the source/drain regions 120-121 are formed in the substrate. In some embodiments, the gate dielectric 140 and the gate electrode 150 may be used to define the lightly-doped portions of the source/drain regions 120-121, and the spacers 160-161 may be used to define the heavily-doped portions of the source/drain regions 120-121.

In some embodiments, the gate dielectric 140 contains silicon oxide, and the gate electrode 150 contains polysilicon. In other embodiments, a gate-replacement process may also be used to form a high-k metal gate. In those embodiments where the gate structure 130 is a high-k metal gate, the gate dielectric 140 contains a high-k dielectric material, and the gate electrode 150 contains a metal material. A high-k dielectric material is a material having a dielectric constant that is greater than a dielectric constant of $SiO_2$, which is approximately 4. For example, the high-k dielectric material may include hafnium oxide ($HfO_2$), which has a dielectric constant that is in a range from approximately 18 to approximately 40. Alternatively, the high-k material may include one of $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO, or combinations thereof.

The metal material of the gate electrode 150 may include a work function metal component and a fill metal component. The work function metal component may be N-type and includes Ti, Al, Ta, $ZrSi_2$, or TaN, or it may be P-type and includes Mo, Ru, Ir, Pt, PtSi, MoN, or WNx. The work function metal component has a range of work functions values associated therein. The work function metal component tunes a work function of the transistor device (e.g., formed by the gate structure 130 and the source/drain regions 120-121) so that a desired threshold $V_t$ voltage is achieved.

The fill metal component of the metal gate electrode serves as the main conductive portion of the gate electrode. The fill metal component may include tungsten, aluminum, copper, or combinations thereof. For the sake of simplicity, the work function metals and the fill metal portions are not separately drawn.

In a gate-replacement process, a dummy gate electrode (typically made of polysilicon) may be formed on the high-k dielectric. After the formation of the source/drain regions 120-121, the dummy gate electrode may be removed and replaced by the metal gate electrode discussed above. This is referred to as a gate-last process flow. In some embodiments, the gate-replacement process may also employ a high-k last process flow, in which a dummy oxide dielectric is formed in place of the high-k dielectric. A dummy polysilicon gate electrode is formed on the dummy oxide gate dielectric. After the formation of the source/drain regions 120-121, the dummy oxide gate dielectric is removed along with the dummy polysilicon gate electrode. The high-k gate dielectric and the metal gate electrode may then be formed to replace the removed dummy gate dielectric and dummy gate electrode.

As is illustrated in FIG. 1, an inter-layer (or inter-level) dielectric (ILD) layer 170 is formed over the substrate 110. The ILD layer 170 may be formed by chemical vapor deposition (CVD), high density plasma CVD, spin-on, sputtering, or other suitable methods. In some embodiments, the ILD layer 170 includes silicon oxide. In other embodiments, the ILD layer 170 may include silicon oxy-nitride, silicon nitride, or a low-k material. The ILD layer 170 surrounds the gate structure 130. A layer 180 is formed over the ILD layer 170. The layer 180 may be a sealing layer to protect the layers and components therebelow. The layer 180 may include a plurality of sub-layers, which are not specifically illustrated for reasons of simplicity.

Figure 2:
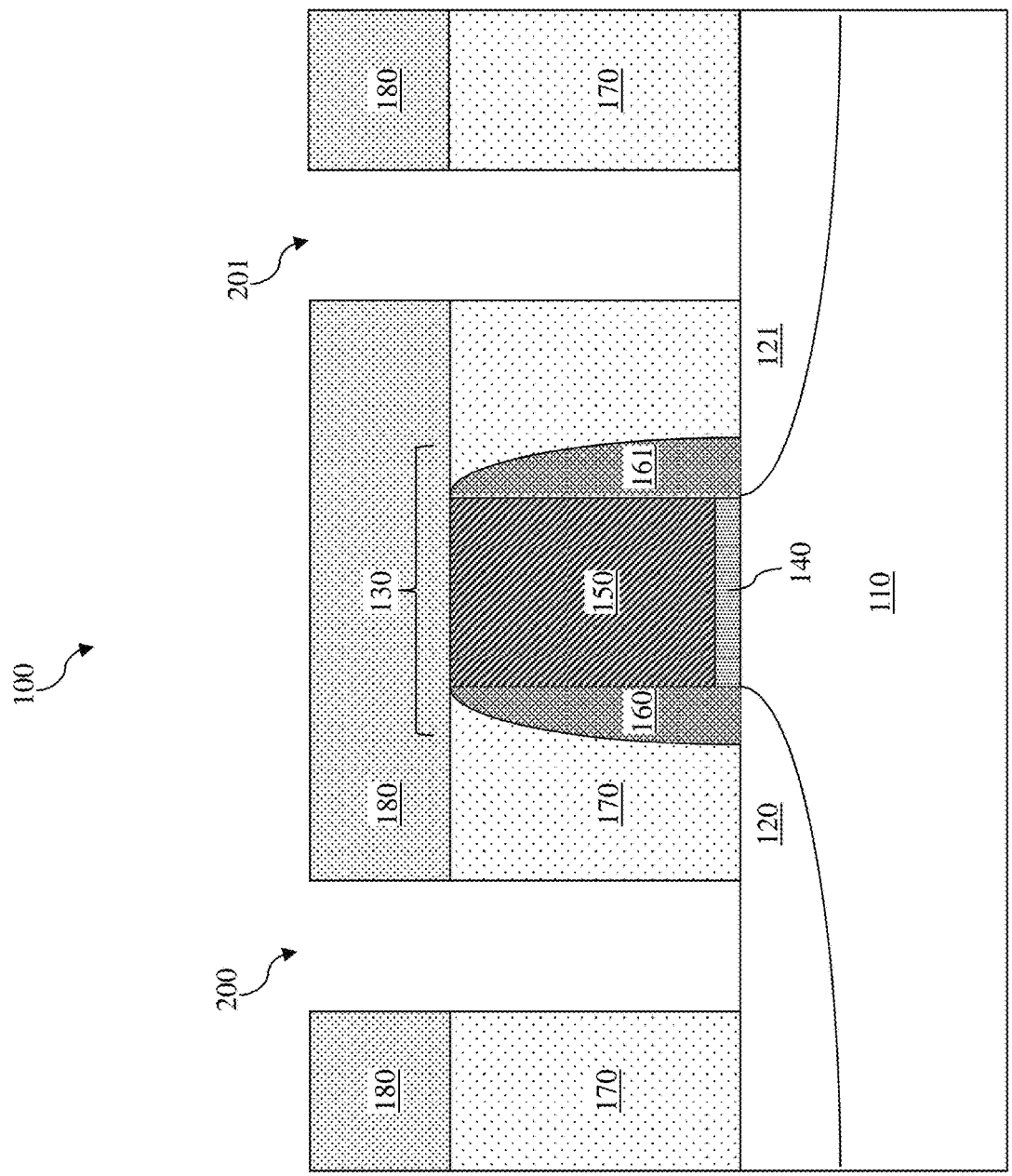

Referring now to FIG. 2, openings 200-201 are formed in the layer 180 and the ILD layer 170. The openings 200-201 may be formed by one or more etching processes known in the art, or by another suitable technique. The openings 200-201 are reserved for the formation of conductive contacts in a later process. These conductive contacts establish electrical connections with source/drain regions 120-121. As such, the openings 200-201 are formed to expose portions of the source/drain regions 120-121, so that a conductive material that is deposited into the openings 200-201 may be in electrical contact with the source/drain regions 120-121.

Figure 3:
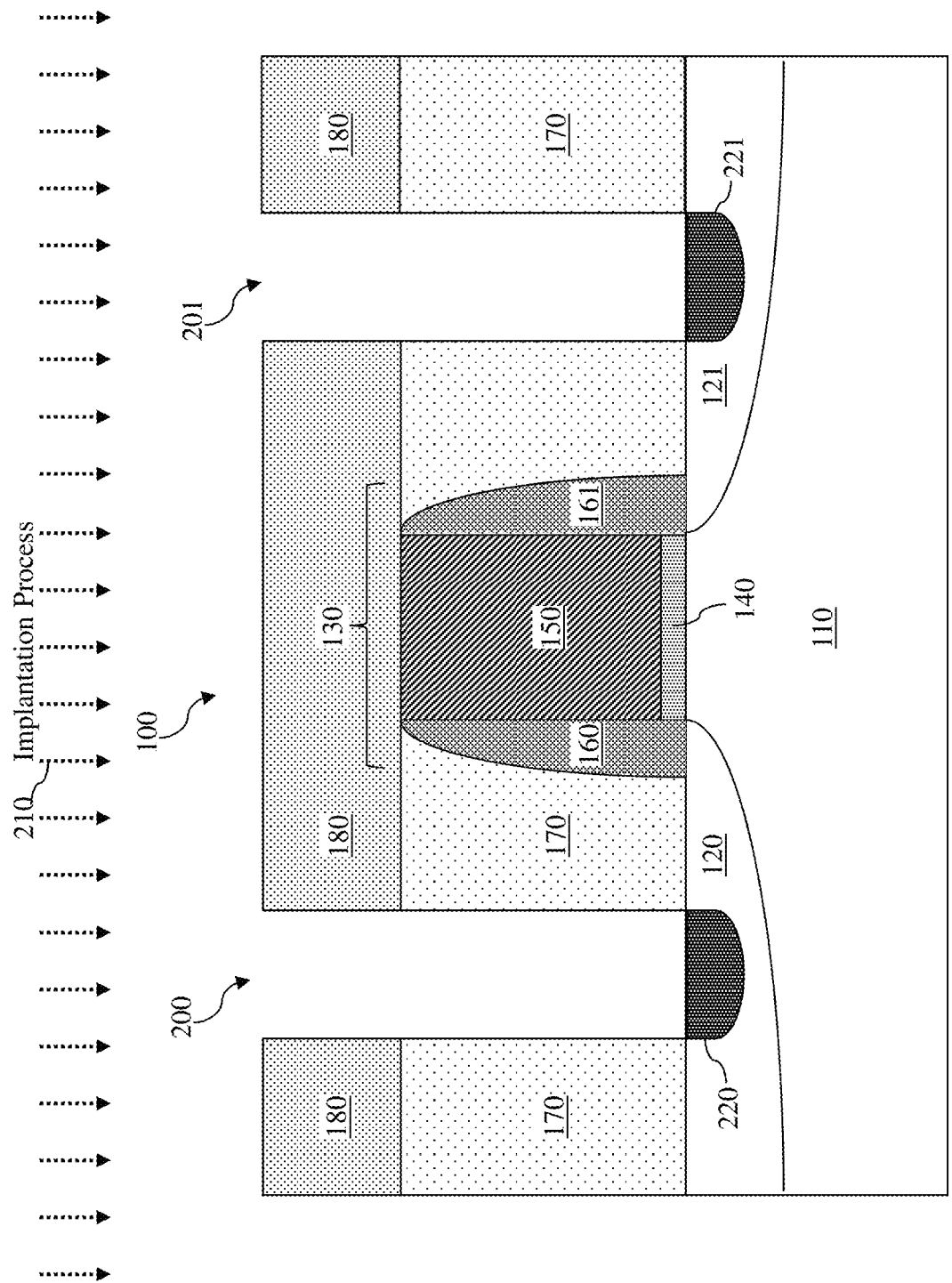

Referring now to FIG. 3, an implantation process 210 is performed. As a part of the implantation process 210, ions bombard the substrate 110 through the openings 200-201, so as to destroy the crystal structure of the silicon material in the portions of the substrate 110 disposed below the openings 200-201. In other words, these portions of the substrate 110 become amorphized after the performance of the implantation process 210, meaning that the silicon material in these portions becomes amorphous silicon.

As illustrated in FIG. 3, amorphous silicon regions 220-221 are formed by the performance of the ion implantation process 210. The amorphous silicon regions 220-221 are respectively formed in portions of the source/drain regions 120-121 exposed by the openings 200-201. In some embodiments, the amorphous silicon regions 220-221 are formed to partially have a curved or non-angular cross-sectional profile. For example, a bottom surface (and partially the side surfaces) of the amorphous silicon regions 220-221 may be somewhat rounded. In some embodiments, the amorphous silicon regions may have a partial cross-sectional profile that approximately resembles an ellipse. According to various aspects of the present disclosure, such amorphous silicon regions 220-221 will lead to better silicide formation, as discussed in more detail below.

In some embodiments, the implantation process 210 may be a cold implantation (or cryo-implantation) process. In other words, the temperature is kept low as the implantation process 210 is performed. For example, the temperature of the implantation process 210 may be in a range from about −60 degrees Celsius to about −100 degrees Celsius. One reason for the low temperature range is to prevent self-annealing from occurring. In more detail, the process of ions being implanted generates heat. For typical implantation processes that are performed at room temperature or higher, the heat generated by the implantation may provide enough energy boost for the amorphized silicon in the regions 220-221 to repair its crystal structure, which is referred to as recrystallization. This process may also be referred to as a "self-annealing" process.

However, according to various aspects of the present disclosure, one of the goals of the implantation process 210 is to create amorphous silicon. It would be undesirable if the newly-created amorphous silicon regions 220-221 to subsequently transform back into a crystal silicon structure through the aforementioned self-annealing process. Thus, in order to prevent the self-annealing from occurring, the temperature of the implantation process 210 is kept low. The low temperature deprives the amorphous silicon in the regions 220-221 of the energy boost needed to recrystallize. Stated differently, when the annealing temperature is kept low, the heat generated by the implantation process alone is not sufficient to cause the amorphous silicon in the regions 220-221 to recrystallize. Hence, the amorphous silicon structure would be kept intact.

In some embodiments, the ions used in the implantation process 210 are silicon ions. In other embodiments, the ions used in the implantation process 210 may be germanium ions, xenon ions, carbon ions, arsenic ions, or nitrogen ions. In some embodiments, the ion implantation process 210 has an implantation energy that is in a range from about 1 keV to about 100 keV.

Figure 4:
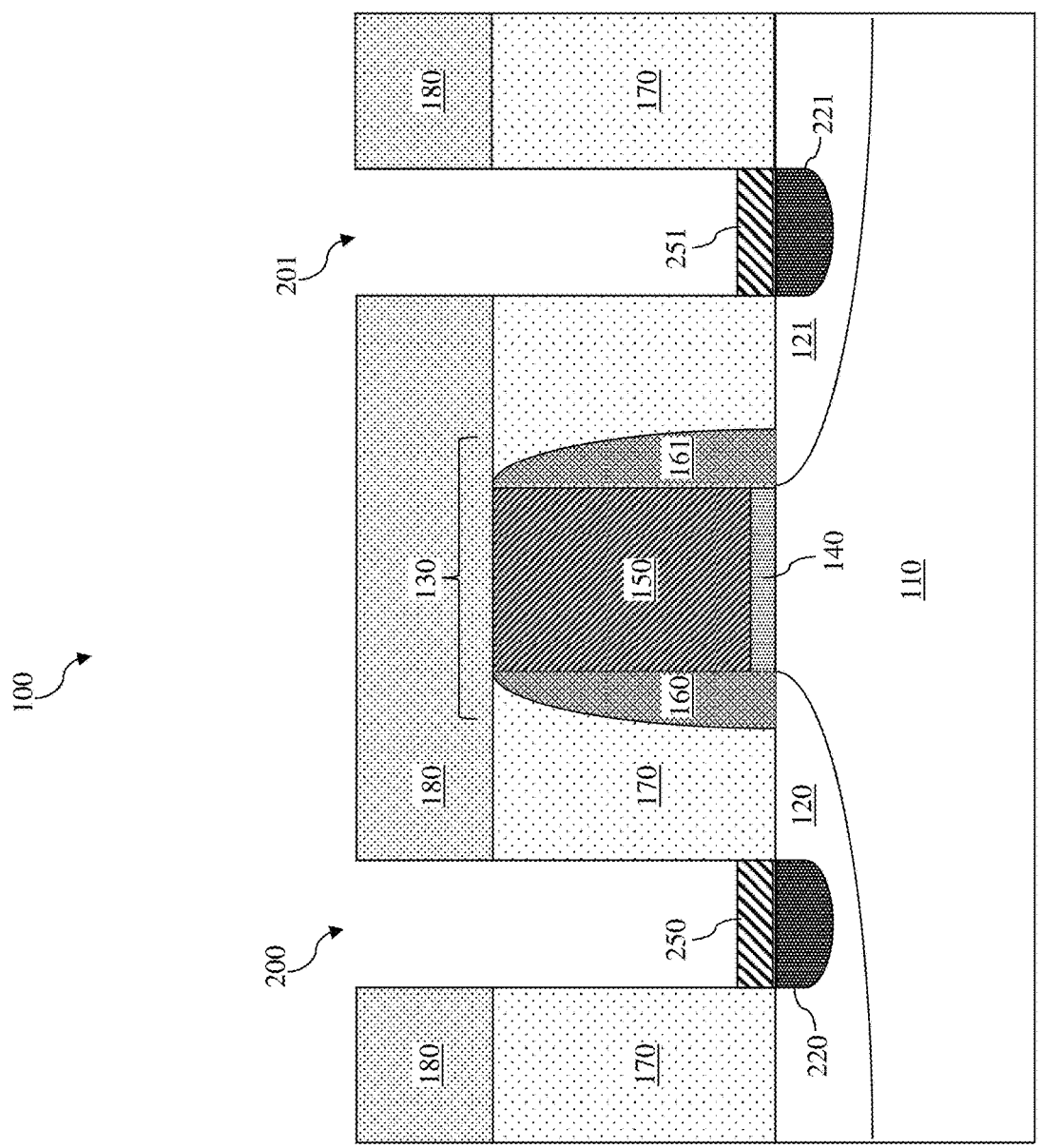

Referring now to FIG. 4, metal materials 250-251 are formed on the amorphous silicon regions 220-221 through the openings 200-201. In some embodiments, the metal materials 250-251 contain nickel. In various embodiments, the metal materials 250-251 may be formed on the surfaces of the amorphous silicon regions 220-221 via one or more deposition processes known in the art, for example CVD, physical vapor deposition (PVD), atomic layer deposition (ALD), or combinations thereof.

Figure 5:
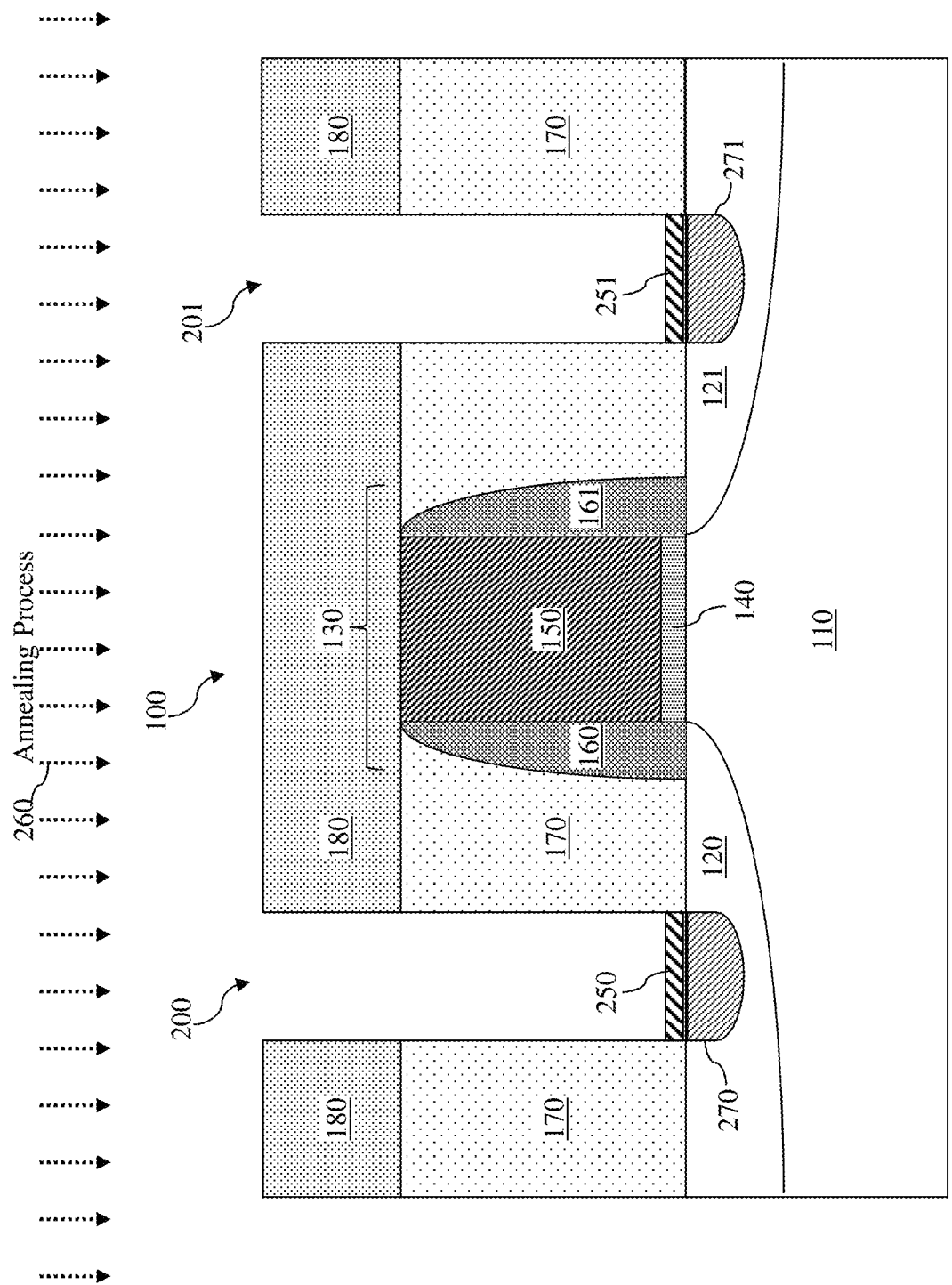

Referring now to FIG. 5, an annealing process 260 is performed to facilitate silicidation. In more detail, the annealing process 260 is performed in a manner such that the metal materials 250-251 will react with the amorphous silicon regions 220-221 below. This reaction leads to the formation of metal silicides 270-271 in place of the amorphous silicon regions 220-221. Alternatively stated, the amorphous silicon in the regions 220-221 is transformed into metal silicide via the reaction with the metal materials 250-251, which is facilitated by the annealing process 260. In embodiments where the metal materials contain nickel, the metal silicides 270-271 are nickel silicides (NiSi).

According to the various aspects of the present disclosure, the annealing process 260 has a unique profile compared to conventional annealing processes. In particular, the annealing process 260 is a spike annealing process (or includes a spike profile). This aspect of the annealing process 260 is explained in more detail with reference to FIGS. 6A and 6B.

In more detail, FIG. 6A illustrates an annealing profile of an example conventional annealing process, and FIG. 6B illustrates an annealing profile of an embodiment of the annealing process 260 shown in FIG. 5. In both FIGS. 6A and 6B, the annealing profile includes an X-axis that represents time, as well as a Y-axis that represents temperature. A plot 280 in FIG. 6A represents how the temperature of the conventional annealing process varies over time, and a plot 281 in FIG. 6B represents how the temperature of the embodiment of the annealing process 260 (FIG. 5) varies over time.

As illustrated in FIG. 6A, the plot 280 has a relatively slow ramp-up period. That is, temperature increases relatively slowly over time. In some embodiments, the temperature will reach a peak range within about 15 seconds to about 30 seconds, for example in about 20 seconds. The peak temperature range may be from about 250 degrees Celsius to about 350 degrees Celsius. Once the temperature reaches a peak level 290 (e.g., between about 250-350 degrees Celsius), it stays there for a relatively long period of time. For example, in some embodiments, the peak level is maintained for a period in a range from about 10 seconds to about 50 seconds. The temperature drops off after the annealing process is over.

In comparison, the plot 281 in FIG. 6B has a fast ramp up period. In the embodiment shown, the temperature has a drastic or rapid ascension (i.e., spike-like profile). For example, the temperature may reach a peak temperature 291 in just between 10 seconds and 100 seconds in some embodiments. In some embodiments, the peak temperature 291 is in a range from about 200 degrees Celsius to about 300 degrees Celsius. Once the peak temperature 291 is reached, it is maintained for a short duration. For example, in some embodiments, the peak temperature 291 is maintained for a time duration in a range from about a few milli-seconds to about a few seconds. Afterwards, the temperature is ramped down, but more slowly than in conventional annealing processes.

One reason for the spike-like profile associated with the annealing process 260 is that it promotes uniform grain growth for the silicide. The inventors have discovered that, the long annealing time for conventional annealing processes (e.g., long duration at which the peak temperature 290 is maintained in FIG. 6A) tends to cause large size deviations in the metal silicide grains formed as a result of the annealing. This may be a result of different silicide grain particles being agglomerated over time, and the long annealing process time thus facilitates the agglomeration of the grain particles. The large deviations in grain size may degrade the performance of the metal silicide, as it may lead to current leakage or reliability issues.

In comparison, the spike-like profile for the annealing process 260 has a much shorter annealing duration, which reduces the agglomeration of silicide grain particles. Therefore, the metal silicides 270-271 (FIG. 5) formed as a result of the annealing process 260 will have more uniform grain sizes, thereby improving device performance and reducing potential defects or failures. For example, by performing the various processes of the present disclosure, the metal silicide grain size deviation may be controlled to be within (i.e., less or equal to) 5 nm. The relatively uniform silicide grain size of the present disclosure helps prevent leakage and may increase a stress voltage tolerance for a contact to be formed on the silicide.

Figure 7:
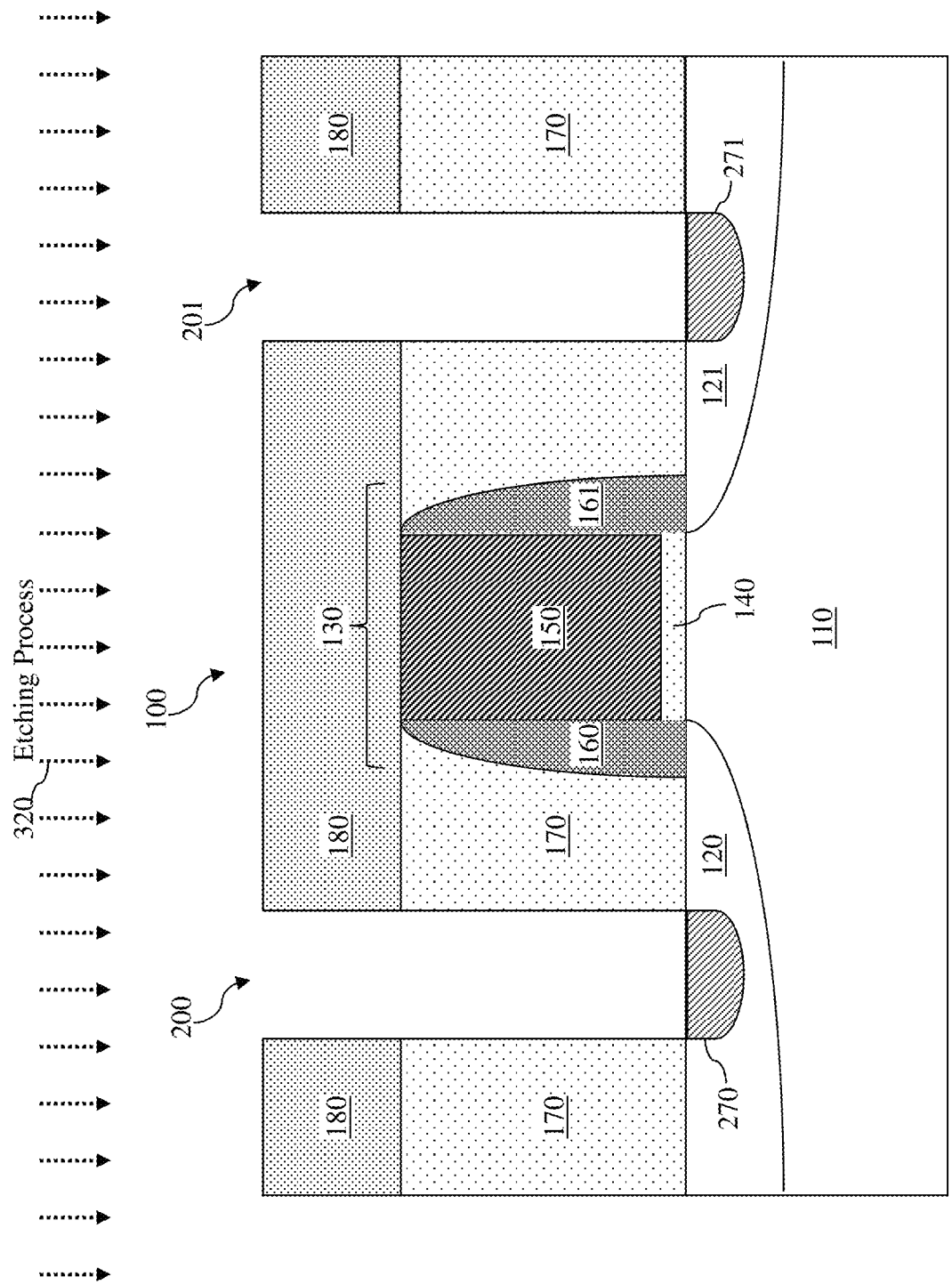

Referring now to FIG. 7, after the annealing process 260 has been performed, an etching process 320 is performed to remove portions of the metal material 250-251 that has not reacted with the amorphous silicon therebelow to form the metal silicides 270-271. In some embodiments, the etching process 320 is a selective etching process, and it etches away the metal materials 250-251 but not the metal silicides 270-271.

Figure 8:
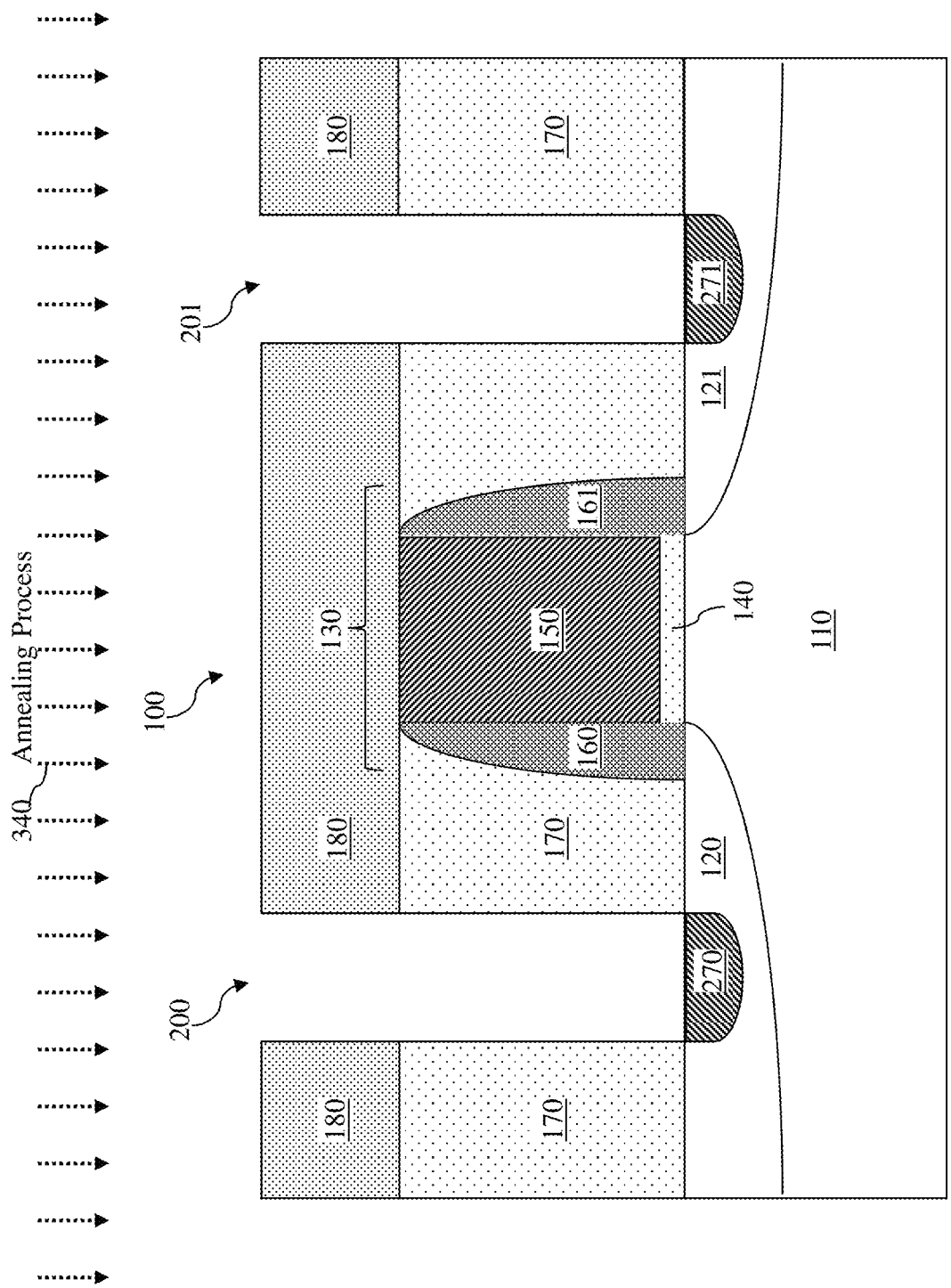

Referring now to FIG. 8, another annealing process 340 is performed to finalize the formation of the metal silicides 270-271. Unlike the annealing process 260, the annealing process 340 does not have a spike-like profile. In some embodiments, the annealing process 340 changes a phase of the metal silicides 270-271 from a higher resistivity phase to a lower resistivity phase. The annealing process 340 may also cause whatever amorphous silicon that is remaining in the substrate 110 to recrystallize.

Figure 9:
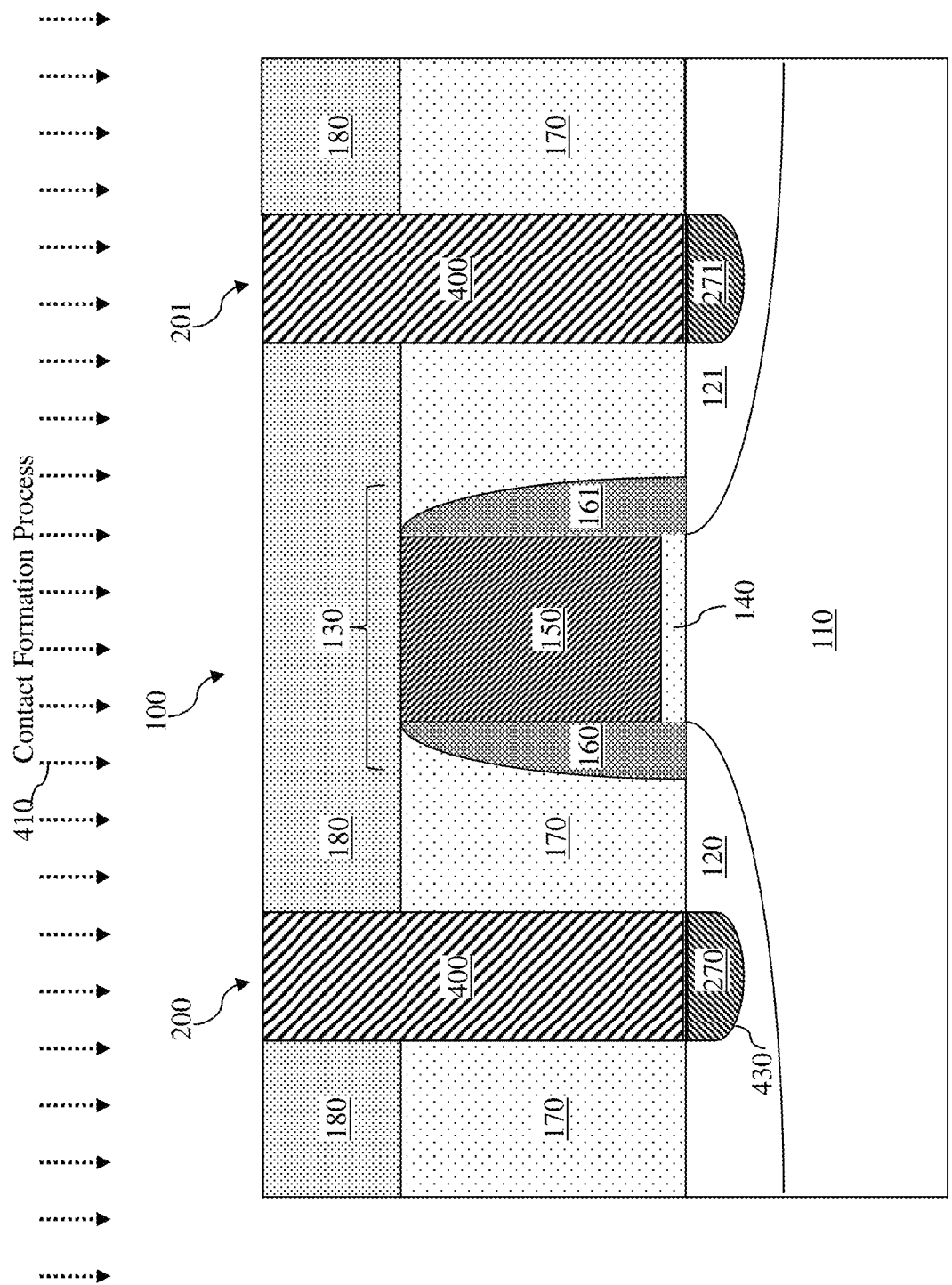

Referring now to FIG. 9, conductive contacts 400 and 401 are formed over the metal silicides 270-271 in the openings 200-201, respectively. The conductive contacts 400-401 may be formed by a contact formation process 410. In some embodiments, the contact formation process 410 may include a deposition process (e.g., CVD, PVD, ALD, etc.) to deposit a metal material such as tungsten, copper, or aluminum in the openings, followed by a polishing process to planarize the surface of the deposited metal so that it is substantially co-planar with the layer 180. In some embodiments, a barrier layer may also be formed prior to the deposition of the metal, so as to prevent diffusion from the conductive contact into the layer 170.

The metal silicides 270-271 serve as electrical interfaces between the conductive contacts 400-401 and the source/drain regions 120-121, respectively. Alternatively, the metal silicides 270-271 may be considered parts of the conductive contacts 400-401 themselves. In any case, since the electrical connection between the conductive contacts 400-401 and the source/drain regions are established through the metal silicides 270-271, it is desirable for the metal silicides 270-271 to have low resistance. Unfortunately, conventional methods of forming silicides usually lead to high resistance for the silicides.

According to the various aspects of the present disclosure, the metal silicides 270-271 have low resistance and high conductivity, which is at least in part attributed to the size and/or shape of the metal silicides. For example, due to the reaction with the amorphous silicon regions 220-221 (FIG. 4) in their formation, the metal silicides 270-271 mostly assume a shape or profile of the amorphous silicon regions 220-221. As discussed above, the amorphous silicon regions 220-221 may be formed to have partially rounded or curved (e.g., ellipse-like) cross-sectional profiles. As such, the metal silicides 270-271 may also at least in part assume such curved or rounded profiles. For example, a surface 430 of the metal silicide 270 may have a rounded or curved cross-sectional profile, which may resemble a portion of an ellipse.

The non-angular profile of the metal silicides 270-271 is one of the visual characteristics of the semiconductor device 100 formed by the methods of the present disclosure, as conventional metal silicides may have a triangle-like shape, particularly in more advanced technology nodes such as a 20-nm technology node. For example, referring now to FIG. 10A, a cross-sectional profile picture of an example metal silicide 450 formed by a conventional process at a 20-nm technology node is shown. The metal silicide 450 has a triangular shape, which encloses a relatively small volume and therefore is associated with a greater resistance.

Figure 10B:
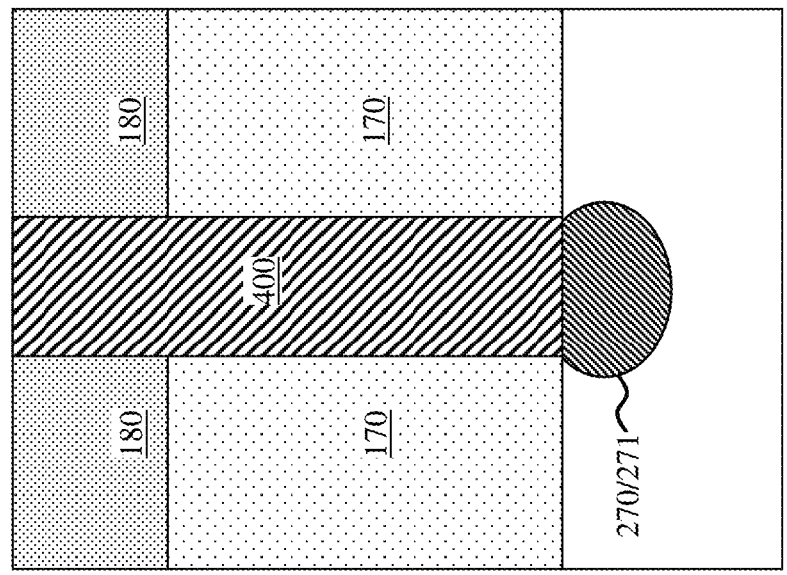
FIGS. 10A and 10B are cross-sectional profiles of an example metal silicide formed by a conventional process and an embodiment of a metal silicide formed by the processes of the present disclosure, respectively.
Figure 10A:
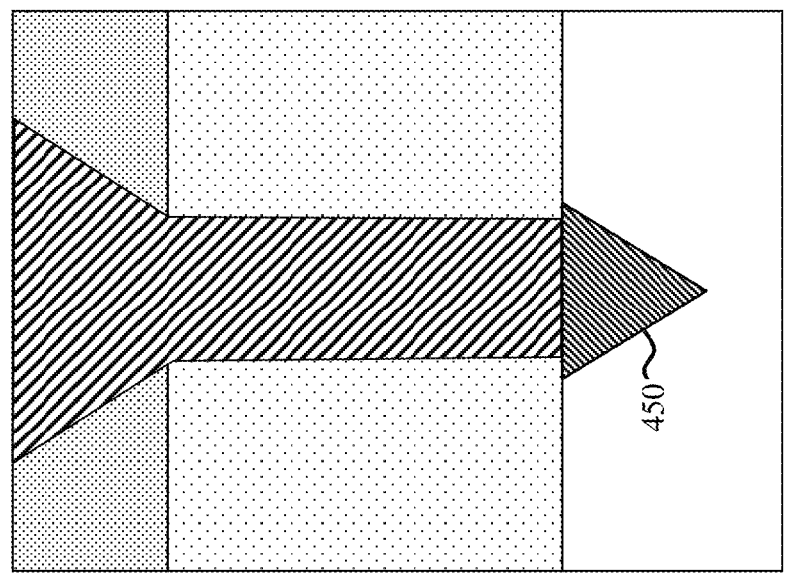

In comparison, FIG. 10B illustrates a cross-sectional profile picture of an embodiment of the metal silicide 270/271 formed using 20-nm technology node processes that incorporate the processes of the present disclosure. The metal silicide 270/271 has an approximately rounded or curved profile that may resemble an ellipse in this case. Among other things, such ellipse-like profile allows the metal silicide 270/271 to enclose a greater volume than the metal silicide 450. In other words, the metal silicide 270/271 formed by the methods of the present disclosure has a substantially greater volume (for example multiple times greater) than the metal silicide 450 formed by conventional processes. The greater volume leads to a lower resistance and higher conductivity. Thus, the metal silicides 270/271 formed by the processes of the present disclosure discussed above have improved performance (e.g., in terms of a contact resistance Rc) over conventional silicides.

The present disclosure also reduces potential extrusion of the metal silicides 270/271. Under conventional fabrication, the resulting metal silicides are formed by reaction with a crystal silicon material (in the source/drain regions). In these situations, there may be lateral diffusion, which may get as far as the channel between source/drain regions (i.e., channel under the gate structure). This may be referred to as silicide extrusion. When this happens, it may create a short circuit situation or cause other defects. In comparison, the formation of the amorphous silicon regions 220-221 (FIG. 3) by the ion implantation process 210 effectively creates a boundary for the metal silicides 270-271. For example, the deposited metal 250-251 may react more quickly with amorphous silicon than with crystal silicon. Thus, a substantial entirety of the amorphous silicon regions 220-221 may be transformed into the metal silicides 270-271 by such reaction before the metal can sufficiently react with neighboring crystal silicon. Therefore, the metal silicides 270-271 may be formed within an artificial confine defined by the amorphous silicon regions 220-221. As a result, undesired silicide extrusion is substantially reduced or prevented, and device performance is improved.

In addition, the cold temperature in which the ion implantation process 210 is performed may also lead to an improved $I_{on}$-$I_{off}$ performance. For example, a colder temperature may induce a fully amorphous layer that contains fewer defects between the silicon and amorphous layer. The fully amorphous layer and the fewer defects result in an improved $I_{on}$-$I_{off}$ performance.

Figure 11:
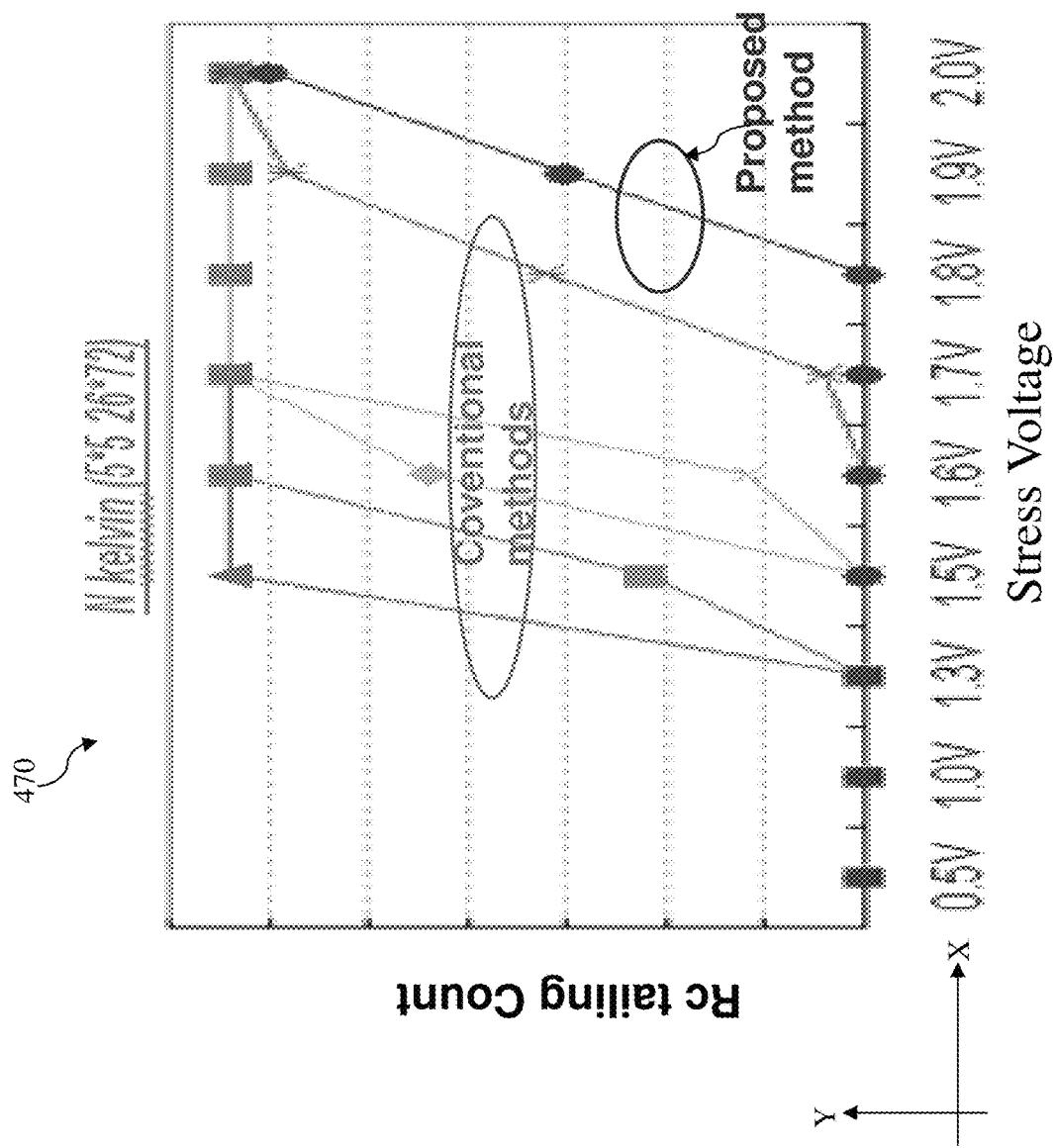
FIG. 11 is a chart illustrating the experimental results of Rc tailing count versus stress voltage.

Referring now to FIG. 11, a chart 470 shows the experimental results obtained for both conventional silicide formation and the silicide formation of the present disclosure. Among other things, the chart 470 illustrates the stress voltage tolerance performance improvement associated with the metal silicide formation according to the present disclosure. In more detail, the chart 470 is a plot of an Rc tailing count (Y-axis) versus stress voltage (X-axis). Rc tailing offers an indication of how much stress voltage can be applied to a conductive contact before the contact can no longer tolerate the stress voltage. According to the chart 470, semiconductor devices associated with various conventional methods begin to show intolerance of the stress voltage at around 1.3 volts to about 1.6 volts, whereas the semiconductor device associated with the present disclosure can withstand up to about 1.8 volts of stress voltage. The greater stress voltage tolerance of the present disclosure may be attributed to the more uniform silicide grains, which are formed by the unique spike annealing process 260 discussed above with reference to FIG. 5.

Figure 12:
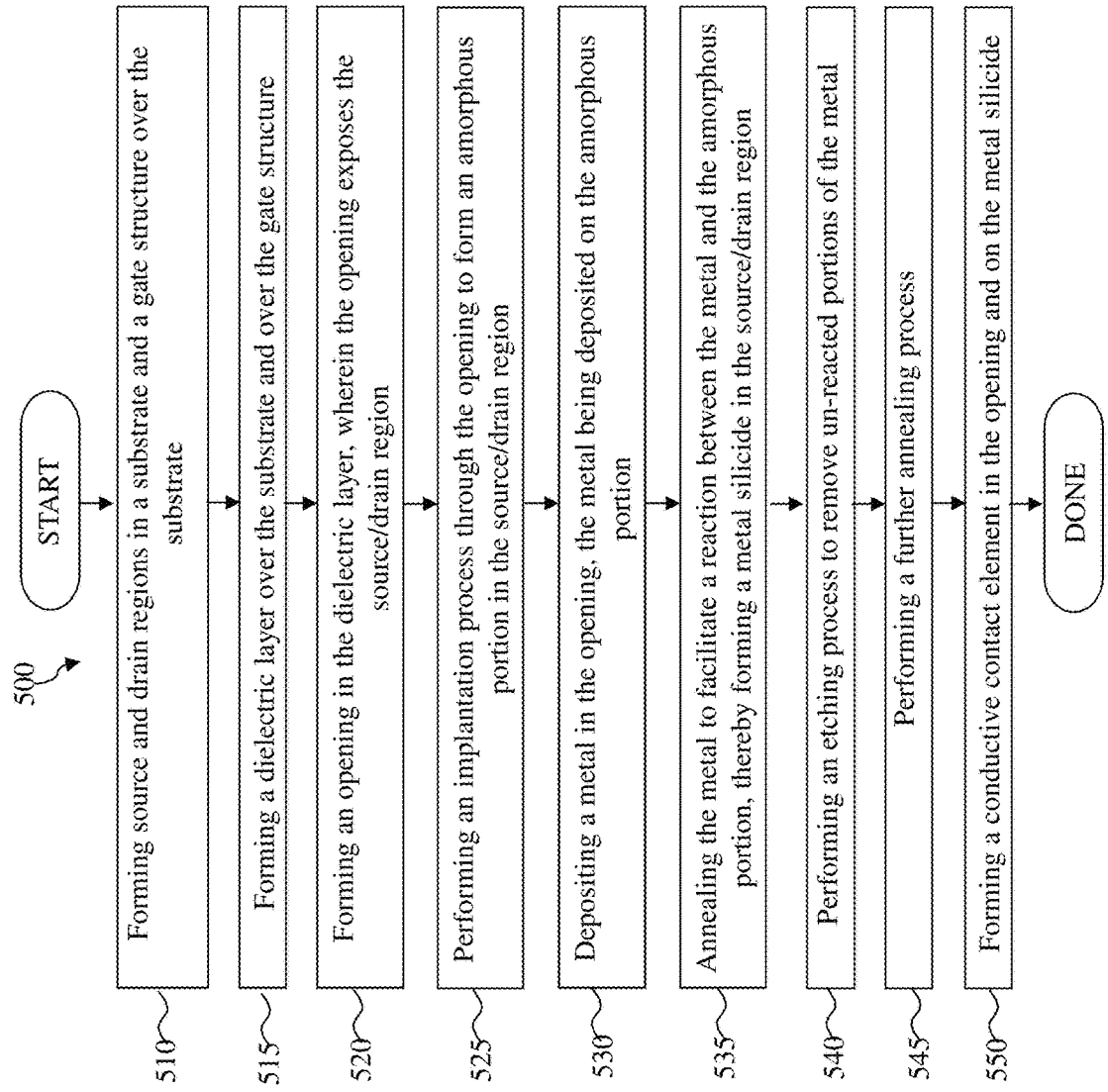
FIG. 12 is a flowchart illustrating a method of fabricating a semiconductor device in accordance with some embodiments.

FIG. 12 is a flowchart of a method 500 for fabricating a semiconductor device in accordance with various aspects of the present disclosure. The method 500 includes a step 510 of forming source and drain regions in a substrate and forming a gate structure over a substrate. In some embodiments, the forming of the gate structure may include a gate-replacement process to form a high-k metal gate. For example, a polysilicon dummy gate electrode may be formed over a high-k gate dielectric, and then after the formation of source and drain regions, the dummy polysilicon gate electrode may be replaced by a metal gate.

The method 500 may include a step 515 of forming a dielectric layer over the substrate and over the gate structure. In embodiments where a gate-replacement process was used to form a high-k metal gate, the dielectric layer may be formed after the dummy gate electrode is formed, but before the metal gate electrode is formed, since the metal gate electrode would be formed within an opening in the dielectric layer created by the removal of the dummy gate electrode.

The method 500 may include a step 520 of forming an opening in the dielectric layer. The opening is formed to expose a portion of the source/drain. The method 500 may include a step 525 of performing an implantation process through the opening to form an amorphous portion in the source/drain region. In some embodiments, the implantation process is a cold implantation process, which may be performed at a temperature range from about −60 degrees Celsius to about −100 degrees Celsius.

The method 500 may include a step 530 of depositing a metal in the opening. The metal is deposited on the amorphous portion. In some embodiments, the metal contains nickel.

The method 500 may include a step 535 of annealing the metal to facilitate a reaction between the metal and the amorphous portion. This reaction forms a metal silicide in the source/drain region. In some embodiments, the annealing process performed in step 535 has a spike profile (or is a spike annealing process). For example, the annealing process may have a sharp temperature increase as shown in FIG. 6B. In some embodiments, the annealing process is performed at a temperature in a range from about 200 degrees Celsius to about 300 degrees Celsius.

The method 500 may include a step 540 of performing an etching process to remove un-reacted portions of the metal after the metal silicide is formed. In some embodiments, the etching process is a selective etching process, so that the metal may be etched away while leaving the metal silicide intact.

The method 500 may include a step 545 of performing a further annealing process after the un-reacted portions of the metal are removed. Unlike the annealing process performed in the step 535, the further annealing process in step 545 does not necessarily have a spike-profile.

The method 500 may include a step 550 of forming a conductive contact element in the opening and on the metal silicide after the further annealing process is performed.

It is understood that additional process steps may be performed before, during, or after the steps 510-550 discussed above to complete the fabrication of the semiconductor device. For example, the method 500 may include additional processes to form an interconnect structure over the contact and over the gate structure. The interconnect structure may include a plurality of metal layers that are interconnected by vias. The method 500 may also include additional packaging, testing, and dicing processes, which are not discussed herein for reasons of simplicity.

The embodiments of the present disclosure offer advantages over existing art, though it is understood that other embodiments may offer different advantages, not all advantages are necessarily discussed herein, and that no particular advantage is required for all embodiments. One of the advantages is that, by using an ion implantation process to form the amorphous silicon in the substrate, it creates an effective boundary for the metal silicide, so as to reduce silicide extrusion that would otherwise lead to potential defects. Another advantage is that the amorphous silicon allows the volume of the metal silicides to be greater, thereby reducing contact resistance. Another advantage is that the cold implantation temperatures minimize recrystallization, thereby preserving the volume of the metal silicides and also improving an $I_{on}$-$I_{off}$ performance. Yet one more advantage is that the unique annealing profile of the first annealing process reduces silicide grain conglomeration, thereby leading to more uniform silicide grain growth compared to conventional methods. The more uniform grain growth leads to reduced leakage and better stress voltage tolerance.

Some embodiments of the present disclosure involve a semiconductor device. The semiconductor device includes a transistor having a source/drain region. A conductive contact is disposed over the source/drain region. A silicide element is disposed below the conductive contact. The silicide element has a non-angular cross-sectional profile.

Some embodiments of the present disclosure involve a semiconductor device. The semiconductor device includes a silicon substrate. A gate structure is disposed over the silicon substrate. A source/drain is formed in the silicon substrate and adjacent to the gate structure. A contact is disposed over the source/drain. The contact contains a metal material. A metal silicide forms an interface between the contact and the source/drain. The metal silicide has a non-triangular shape in a cross-sectional side view.

Some embodiments of the present disclosure involve a method of fabricating a semiconductor device. A substrate is provided. The substrate has a source/drain region formed therein and a dielectric layer formed thereover. An opening is formed in the dielectric layer. The opening exposes the source/drain region. An implantation process is performed through the opening to form an amorphous portion in the source/drain region. A metal is deposited in the opening. The metal is deposited on the amorphous portion. The metal is annealed to facilitate a reaction between the metal and the amorphous portion, thereby forming a metal silicide in the source/drain region.

Some embodiments of the present disclosure involve a method of fabricating a semiconductor device. A substrate is provided. The substrate has a source/drain region formed therein and a dielectric layer formed thereover. An opening is formed in the dielectric layer. The opening exposes the source/drain region. A metal is deposited on the substrate in the opening. An annealing process is performed to cause the metal to react with a portion of the substrate disposed therebelow. A reaction of the metal and the portion of the substrate forms a metal silicide in the source/drain region. The annealing process has a spike profile.

Some embodiments of the present disclosure involve a method of fabricating a semiconductor device. A substrate is provided. The substrate has a source/drain region formed therein and a dielectric layer formed thereover. A contact hole is etched in the dielectric layer to expose a portion of the source/drain region. A metal material is formed on the source/drain region exposed by the opening. A first annealing process is performed to facilitate a reaction between the metal material and the portion of the source/drain region disposed therebelow, thereby forming a metal silicide in the substrate, wherein the first annealing process is a spike annealing process. A remaining portion of the metal material is removed after the performing of the first annealing process. Thereafter, a second annealing process is performed. Thereafter, a contact is formed in the contact hole and on the metal silicide.

Some embodiments of the present disclosure involve a method of fabricating a semiconductor device. A substrate is provided. The substrate has a source/drain region formed therein and a dielectric layer formed thereover. An opening is formed in the dielectric layer to expose a portion of the source/drain region. A nickel material is formed on the source/drain region exposed by the opening. A first annealing process is performed to facilitate a reaction between the nickel material and the portion of the source/drain region disposed therebelow, thereby forming a nickel silicide in the substrate. The first annealing process has a sharp ascension in temperature and is performed at an annealing temperature in a range from about 200 degrees Celsius to about 300 degrees Celsius. A remaining portion of the nickel material is removed after the performing of the first annealing process. Thereafter, a second annealing process is performed. Thereafter, a conductive contact is formed in the opening. The conductive contact is formed on the nickel silicide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a transistor having a source/drain region;
a conductive contact disposed over the source/drain region; and
a silicide element disposed below the conductive contact, wherein the silicide element has a non-angular cross-sectional profile, wherein the silicide element contains nickel silicide grains, and wherein a size deviation among the nickel silicide grains is less than, or equal to, 5 nanometers.

2. The semiconductor device of claim 1, wherein:
a bottom surface of the silicide element has an approximately rounded cross-sectional profile; and
sidewalls of the silicide element are substantially straight and aligned with sidewalls of the conductive contact.

3. The semiconductor device of claim 2, wherein the bottom surface of the silicide element has an approximately elliptical cross-sectional profile.

4. The semiconductor device of claim 1, wherein the silicide element is disposed in a manner such that it forms an interface between the conductive contact and the source/drain region.

5. The semiconductor device of claim 1, wherein the transistor is a high-k metal gate transistor, and wherein the semiconductor device is a 20-nanometer technology node device.

6. The semiconductor device of claim 1, wherein the source/drain region is disposed within a substrate, and wherein the substrate comprises recrystallized amorphous silicon.

7. A semiconductor device, comprising:
a silicon substrate;
a gate structure disposed over the silicon substrate, the gate structure including a high-k gate dielectric and a metal gate electrode;
a source/drain formed in the silicon substrate and adjacent to the gate structure; and
a contact disposed over the source/drain, the contact containing a metal material, wherein a metal silicide forms an interface between the contact and the source/drain, and wherein sidewalls of the metal silicide are substantially flush with sidewalls of the contact in a cross-sectional side view.

8. The semiconductor device of claim 7, wherein a bottom surface of the metal silicide has an approximately curved shape in the cross-sectional side view.

9. The semiconductor device of claim 7, wherein the sidewalls of the metal silicide are substantially straight in the cross-sectional side view.

10. The semiconductor device of claim 7, wherein:
the metal silicide contains nickel silicide grains; and
a size variation amongst the nickel silicide grains is within 5 nanometers.

11. The semiconductor device of claim 7, wherein the silicon substrate contains recrystallized amorphous silicon.

12. The semiconductor device of claim 7, wherein the semiconductor device includes a 20-nanometer technology node device.

13. A semiconductor device, comprising:
a substrate;
a gate structure of a transistor disposed over the substrate;
a source/drain of the transistor disposed in the substrate;
a conductive contact disposed over the source/drain; and
a metal silicide disposed between the conductive contact and the source/drain, and wherein in a cross-sectional side view: a sidewall of the metal silicide is substantially straight and is aligned with a sidewall of the conductive contact, and a bottom surface of the metal silicide is rounded.

14. The semiconductor device of claim 13, wherein the bottom surface has an ellipse-like geometric profile.

15. The semiconductor device of claim 13, wherein the metal silicide comprises nickel silicide, and wherein the substrate contains amorphous silicon that has been recrystallized.

16. The semiconductor device of claim 13, wherein a deviation in silicide grain sizes within the metal silicide is less than 5 nanometers.

17. The semiconductor device of claim 13, wherein the transistor comprises a 20-nanometer technology node transistor.

18. The semiconductor device of claim 13, wherein the gate structure includes a high-k gate dielectric and a metal gate electrode.

19. The semiconductor device of claim 13, wherein the metal silicide is disposed below an upper surface of the substrate.

20. The semiconductor device of claim 13, wherein an entirety of the metal silicide is disposed within the source/drain.

* * * * *